(12) United States Patent
Yoon et al.

(10) Patent No.: US 8,546,819 B2
(45) Date of Patent: Oct. 1, 2013

(54) LIGHT EMITTING DEVICE AND FABRICATION METHOD THEREOF

(75) Inventors: Yeo Jin Yoon, Ansan-si (KR); Chang Yeon Kim, Ansan-si (KR)

(73) Assignee: Seoul Opto Device Co., Ltd., Ansan-si (KR)

( * ) Notice: Subject to any disclaimer, the term of this patent is extended or adjusted under 35 U.S.C. 154(b) by 0 days.

(21) Appl. No.: 13/235,063

(22) Filed: Sep. 16, 2011

(65) Prior Publication Data

US 2012/0241787 A1 Sep. 27, 2012

Related U.S. Application Data

(62) Division of application No. 12/518,846, filed as application No. PCT/KR2007/006463 on Dec. 12, 2007, now Pat. No. 8,053,789.

(30) Foreign Application Priority Data

| Dec. 28, 2006 | (KR) | 10-2006-0136681 |
| Dec. 28, 2006 | (KR) | 10-2006-0136682 |
| Dec. 28, 2006 | (KR) | 10-2006-0136683 |

(51) Int. Cl.
*H01L 27/15* (2006.01)

(52) U.S. Cl.
USPC .............. 257/82; 257/86; 438/22; 438/29

(58) Field of Classification Search
CPC .......... H01L 33/24; H01L 33/26; H01L 33/12
USPC .... 257/82, 86, 90, 98, E33.001; 438/22–47, 438/669

See application file for complete search history.

(56) References Cited

U.S. PATENT DOCUMENTS

| 5,491,350 A | 2/1996 | Unno et al. |
| 6,429,460 B1 * | 8/2002 | Chen et al. .................. 257/79 |

(Continued)

FOREIGN PATENT DOCUMENTS

| JP | 07-193275 | 7/1995 |
| JP | 2006-324661 | 11/2006 |

OTHER PUBLICATIONS

International Search Report of PCT/KR2007/006463 dated on Mar. 24, 2008.
Written Opinion of PCT/KR2007/006463 dated on Mar. 24, 2008.

(Continued)

*Primary Examiner* — Khiem D Nguyen
(74) *Attorney, Agent, or Firm* — H. C. Park & Associates, PLC

(57) ABSTRACT

A method of fabricating a vertical light emitting diode including: growing a low doped first semiconductor layer on a sacrificial substrate; forming an aluminum layer on the low doped first semiconductor; forming an AAO layer having a large number of holes formed therein by anodizing the aluminum layer; etching and patterning the low doped first semiconductor layer using the aluminum layer as a shadow mask, thereby forming grooves; removing the aluminum layer remaining; sequentially forming a high doped first semiconductor layer, an active layer and a second semiconductor layer on the low doped first semiconductor layer with the grooves; forming a metal reflective layer and a conductive substrate on the second semiconductor layer; separating the sacrificial substrate; and forming an electrode pad on the other surface of the low doped first semiconductor layer, the electrode pad filled in the grooves and in ohmic contact with the high doped first semiconductor.

16 Claims, 10 Drawing Sheets

(56) References Cited

U.S. PATENT DOCUMENTS

| | | | |
|---|---|---|---|
| 6,495,862 B1 | 12/2002 | Okazaki et al. | |
| 2003/0178626 A1* | 9/2003 | Sugiyama et al. | 257/79 |
| 2005/0156185 A1 | 7/2005 | Kim et al. | |
| 2006/0118803 A1* | 6/2006 | Lee et al. | 257/98 |
| 2006/0270206 A1 | 11/2006 | Cho et al. | |
| 2007/0041214 A1* | 2/2007 | Ha et al. | 362/612 |

OTHER PUBLICATIONS

Non-final Office Action of U.S. Appl. No. 12/518,846 issued on Mar. 24, 2011.

Notice of Allowance of U.S. Appl. No. 12/518,846 issued on Aug. 26, 2011.

* cited by examiner

Prior Art

LIGHT EMITTING DEVICE AND FABRICATION METHOD THEREOF

CROSS-REFERENCE TO RELATED APPLICATIONS

This application is a divisional of U.S. patent application Ser. No. 12/518,846, filed on Jun. 11, 2009 issued as U.S. Pat. No. 8,053,789, which is the National Stage of International Application No. PCT/KR2007/006463, filed Dec. 12, 2007, and claims priority from and the benefit of Korean Patent Application No. 10-2006-0136681, filed on Dec. 28, 2006, Korean Patent Application No. 10-2006-0136682, filed on Dec. 28, 2006, and Korean Patent Application No. 10-2006-0136683, filed on Dec. 28, 2006, which are all hereby incorporated by reference for all purposes as if fully set forth herein.

BACKGROUND OF THE INVENTION

1. Field of the Invention

The present invention relates to a light emitting device and a fabrication method thereof. More particularly, the present invention relates to a method of fabricating a substrate for a light emitting diode, on which patterns are formed using an anodic aluminum oxide (AAO) layer as a shadow mask; a vertical light emitting diode having a patterned semiconductor layer using an AAO layer and a fabrication method thereof; and a light emitting device having scattering centers using an AAO layer and a fabrication method thereof.

2. Discussion of the Background

A light emitting diode (LED), which is a representative one of light emitting devices, is a photoelectric conversion device having a structure, in which an N-type semiconductor and a P-type semiconductor are joined together, and emits predetermined light through recombination of electrons and holes. A GaN-based LED is known as such an LED. The GaN-based LED is fabricated by sequentially laminating a GaN-based N-type semiconductor layer, an active layer (or light emitting layer) and a P-type semiconductor layer on a substrate made of a material such as sapphire or SiC.

Light generated in an LED is not entirely emitted to the outside, but a large amount of light is lost inside the LED. Therefore, in order to enhance light efficiency of an LED, it is required to allow light generated from the LED not to be lost inside a semiconductor but to be emitted to the outside as much as possible.

When light passes through an interface between two media having different refraction indices, reflection and transmission of the light occur at the interface between the two media. If an incident angle is greater than a certain angle, transmission does not occur but total reflection occurs. In this case, the certain angle is referred to as a critical angle.

Due to the total refraction, when light emitted from an active layer proceeds toward a transparent electrode with an angle over the critical angle in an LED, the light is totally reflected at the transparent electrode and confined within the LED to be absorbed into an epitaxial layer and a sapphire substrate of the LED. Therefore, there is a problem that light efficiency of the LED may be lowered.

To solve such a problem, there is a method using a patterned sapphire substrate (PSS).

FIG. 1 is a view illustrating a method of fabricating a patterned sapphire substrate according to a prior art.

Referring to FIG. 1, a bent pattern 3 is formed on a sapphire substrate 1. A light emitting cell of an LED is grown on the pattern 3 of the sapphire substrate 1.

That is, before a semiconductor layer for forming a light emitting cell is grown, a bent pattern 3 with a specific shape is formed by patterning a sapphire substrate 1. Then, the semiconductor layer is grown on the bent pattern 3, thereby extracting the light that is not extracted to the outside of an LED due to total refraction.

As such, the inside light can be extracted to the outside by designing a structure of an LED to have a difference of refraction indices in a lateral direction.

However, in the prior art, since a photoresist layer 2 for forming the pattern 3 is formed on the substrate 1 and a pattern mask layer is then fabricated by photolithography for removing a predetermined region of the mask layer 2, the pattern mask layer is restricted by the size of the pattern. As the size of a pattern formed on a substrate is increased, a semiconductor layer should be grown to have a thickness greater than is necessary when the semiconductor layer is formed later.

In addition, as delicate photolithography is used, a fabrication process is difficult, fabrication cost is high, mass-productivity and reproductivity are lowered, and it is difficult to fabricate various shapes of patterns.

Meanwhile, since a nitride of a Group III element, such as GaN or AlN, generally has an excellent thermal stability and a direct transition type energy band structure, it has recently come into the spotlight as a substance for light emitting devices in blue and ultraviolet regions. Particularly, blue and green light emitting devices using GaN have been used in a variety of fields such as large-scale, full-color flat panel displays, traffic lights, indoor illumination, high-density light sources, high-resolution output systems and optical communications.

Such a nitride semiconductor layer of a Group III element, particularly GaN, is grown on a different kind of substrate with a similar crystal structure through a process such as metal organic chemical vapor deposition (MOCVD) or molecular beam epitaxy (MBE) because it is difficult to fabricate the same kind of substrate on which the nitride semiconductor layer can be grown. A sapphire substrate with a hexagonal system structure is mainly used as the different type of substrate. However, since sapphire is electrically non-conductive, the sapphire restricts a structure of an LED. Since the sapphire is mechanically and chemically stable, the sapphire is difficult to be subjected to processing such as cutting or shaping and has low thermal conductivity. Therefore, studies have been recently conducted to fabricate an LED with a vertical structure by growing nitride semiconductor layers on a different kind of substrate such as sapphire and then separating the different kind of substrate from the nitride semiconductor layers.

FIG. 2 is a sectional view of a vertical LED according to a prior art.

Referring to FIG. 2, the vertical LED has a conductive substrate 31.

The conductive substrate 31 may be a substrate made of Si, GaAs, GaP, AlGaInP, Ge, SiSe, GaN, AlInGaN, InGaN or the like, or a substrate made of a single metal of Al, Zn, Ag, W, Ti, Ni, Au, Mo, Pt, Pd, Cu, Cr or Fe, or an alloy thereof. Meanwhile, compound semiconductor layers are III-N-based compound semiconductor layers. First and second conductive types respectively designate N-type and P-type, or P-type and N-type.

Compound semiconductor layers including a first conductive semiconductor layer 15, an active layer 17 and a second conductive semiconductor layer 19 are formed on the conductive substrate 31. Further, an ohmic electrode layer 41, a metal reflective layer 43, a diffusion barrier layer 45 and a bonding metal layer 47 are interposed between the semiconductor layers and the conductive substrate 31.

The compound semiconductor layers are generally grown on a sacrificial substrate (not shown) such as a sapphire substrate by MOCVD or the like. Thereafter, the ohmic electrode layer 41, the metal reflective layer 43, the diffusion barrier layer 45 and the bonding metal layer 47 are formed on the compound semiconductor layers, and the conductive substrate 31 is then attached thereto. Subsequently, the sacrificial substrate is separated from the compound semiconductor layers using a laser lift-off technique or the like, and the first conductive semiconductor layer 15 is exposed. An electrode pad 33 is then formed on the exposed first conductive semiconductor layer 15. Accordingly, the conductive substrate 31 with excellent heat radiation performance is employed, thereby improving light emitting efficiency of an LED and providing the LED with a vertical structure as shown in FIG. 2.

In such a vertical LED, the first conductive semiconductor layer 15 may be generally divided into a low doped first conductive semiconductor layer 15a, which is grown at a low doping concentration when it is initially grown on a sacrificial substrate, and a high doped first conductive semiconductor layer 15b, which is grown at a high doping concentration on the low doped first conductive semiconductor layer 15a, depending on the doping concentration of dopant in growth of the first conductive semiconductor layer 15.

In order to improve an electrical characteristic and therefore a light emitting characteristic when the first conductive semiconductor layer 15 is exposed by the separation of the sacrificial substrate and the electrode pad 33 is then formed on the exposed first conductive semiconductor layer 15, the electrode pad 33 should be connected to the high doped first conductive semiconductor layer 15b rather than the low doped first conductive semiconductor layer 15a.

To this end, after separating the sacrificial substrate, the low doped first conductive semiconductor layer 15a should be removed through wet or dry etching or back surface grinding to expose the high doped first conductive semiconductor layer 15b. However, in order to etch the low doped first conductive semiconductor layer 15a down to the high doped first conductive semiconductor layer 15b, it is important to manage the etching. Further, since the wet etching is defect etching, even the active layer 17 may be damaged. Furthermore, since a precise processing is required for the different surface etching, it is difficult to ensure evenness.

SUMMARY OF THE INVENTION

An object of the present invention is to provide a patterned substrate which is fabricated by easy processes and has a high mass-productivity and reproductivity.

Another object of the present invention is to have a large number of scattering centers formed of an air layer by etching using an AAO layer in a semiconductor layer as a shadow mask so that light generated in an LED is not lost therein but emitted to the outside, thereby increasing the amount of light scattered through the scattering centers formed of the air layer with a refraction index different from the semiconductor layer to be emitted to the outside.

A further object of the present invention is to easily perform a process of forming an electrode pad on the first conductive semiconductor layer in a vertical LED so that the electrode pad is connected to a highly doped portion of the first conductive semiconductor layer, which is exposed by separating a sacrificial substrate.

According to an aspect of the present invention, there is provided a method of fabricating a patterned substrate for fabricating a light emitting diode (LED), which comprises the steps of: forming an aluminum layer on a substrate; forming an anodic aluminum oxide (AAO) layer having a large number of holes formed therein by performing anodizing treatment of the aluminum layer; partially etching a surface of the substrate using the aluminum layer with a large number of the holes as a shadow mask, thereby forming patterns; and removing the aluminum layer remaining on the substrate.

Preferably, the substrate is any one of a sapphire substrate, a spinel substrate, a Si substrate, a SiC substrate, a ZnO substrate, a GaAs substrate and a GaN substrate.

According to another aspect of the present invention, there is provided a method of fabricating a vertical LED, which comprises the steps of: growing a low doped first conductive semiconductor layer on a sacrificial substrate; forming an aluminum layer on the low doped first conductive semiconductor layer; forming an AAO layer having a large number of holes formed therein by performing anodizing treatment of the aluminum layer; etching and patterning the low doped first conductive semiconductor layer using the aluminum layer with a large number of the holes as a shadow mask to expose a portion of the low doped first conductive semiconductor layer, thereby forming a large number of grooves; removing the aluminum layer remaining on the low doped first conductive semiconductor layer; sequentially forming a high doped first conductive semiconductor layer, an active layer and a second conductive semiconductor layer on the low doped first conductive semiconductor layer with a large number of the grooves; forming a metal reflective layer and a conductive substrate on the second conductive semiconductor layer; separating the sacrificial substrate; and forming an electrode pad on the other surface of the low doped first conductive semiconductor layer, the electrode pad being filled in a large number of the grooves to be in ohmic contact with the high doped first conductive semiconductor layer.

Preferably, the doping concentration of dopant in the high doped first conductive semiconductor layer is 5 to $9 \times 10^{18}$/ $cm^3$, and the doping concentration of dopant in the low doped first conductive semiconductor layer is below $5 \times 10^{18}$/$cm^3$.

According to a further aspect of the present invention, there is provided a vertical LED, comprising: a low doped first conductive semiconductor layer having a large number of grooves formed therein; a high doped first conductive semiconductor layer formed on one surface of the low doped first conductive semiconductor layer, the high doped first conductive semiconductor layer being exposed by a large number of the grooves of the low doped first conductive semiconductor layer; an active layer and a second conductive semiconductor layer, formed on one surface of the high doped first conductive semiconductor layer; a metal reflective layer and a conductive substrate, formed on one surface of the second conductive semiconductor layer; and an electrode pad formed on the other surface of the low doped first conductive semiconductor layer, the electrode pad being filled in a large number of the grooves to be in ohmic contact with the high doped first conductive semiconductor layer.

Preferably, the doping concentration of dopant in the high doped first conductive semiconductor layer is 5 to $9 \times 10^{18}$/$cm^3$ and the doping concentration of dopant in the low doped first conductive semiconductor layer is below $5 \times 10^{18}$/$cm^3$.

Preferably, the low doped first conductive semiconductor layer has a large number of the grooves formed through etching using an AAO layer as a shadow mask.

According to a still further aspect of the present invention, there is provided a method of fabricating a light emitting device having a first conductive semiconductor layer, a second conductive semiconductor layer and an active layer interposed therebetween formed on a substrate. The method comprises the steps of: primarily growing the first conductive semiconductor layer on the substrate; forming an aluminum layer on the first conductive semiconductor layer; forming an AAO layer having a large number of holes formed therein by performing anodizing treatment of the aluminum layer; etching and patterning the first conductive semiconductor layer using the aluminum layer with a large number of the holes as a shadow mask so that a portion of the first conductive semiconductor layer is etched; removing the aluminum layer remaining on the first conductive semiconductor layer; secondarily growing the first conductive semiconductor layer; and forming an active layer and a second conductive semiconductor layer on the first conductive semiconductor layer.

According to a still further aspect of the present invention, there is provided a light emitting device, which comprises: a substrate; a first conductive semiconductor layer formed on the substrate; an active layer formed on the first conductive semiconductor layer; and a second conductive semiconductor layer formed on the active layer, wherein the first conductive semiconductor layer includes a large number of scattering centers formed of an air layer.

Preferably, the first conductive semiconductor layer comprises a first layer having a large number of the scattering centers formed of an air layer and a second layer formed on the first layer.

Preferably, a large number of the scattering centers formed of the air layer are formed in the first conductive semiconductor layer through etching using an AAO layer as a shadow mask.

According to the present invention, patterns can be formed on a substrate by forming an AAO layer with a large number of holes by anodizing treatment of an aluminum layer and then performing etching using the aluminum layer with a large number of the holes as a shadow mask. In this case, the pattern may be formed to have a diameter of a few μm, e.g., 500 nm or less. As the diameter of the pattern is smaller than that of a pattern produced by a method using a conventional mask, it is possible to reduce the thickness of a semiconductor layer laminated on the substrate and to enhance the light emitting efficiency.

That is, as the diameter of the patterns formed on the substrate is similar to the wavelength band of emitted light, the amount of light reflected to the outside by the patterns formed on the substrate is increased. Accordingly, the light emitting efficiency can be enhanced.

According to the present invention, it is possible to omit complicated processes, such as a thin film layer forming process and a patterning and etching process, required to form a conventional mask (or pattern layer). Therefore, the conventional complicated processes required to form the mask (or pattern layer) are omitted, thereby enhancing the mass-productivity and reproducibility and remarkably reducing yield degradation and time loss caused by the conventional complicated processes.

In addition, when performing anodizing treatment for forming an AAO layer with a large number of holes formed thereon, the amplitude of a voltage, time and an amount of solution are controlled, whereby the shape and size of a pattern are also controlled. Accordingly, patterns with various shapes can be easily formed on a substrate if necessary.

According to the present invention, in a vertical LED, an AAO layer with a large number of holes is formed by performing anodizing treatment of an aluminum layer on a low doped first conductive semiconductor layer, and etching is performed using the aluminum layer with a large number of the holes as a shadow mask, thereby forming patterns in the low doped first conductive semiconductor layer. After forming a high doped first conductive semiconductor layer thereon, a sacrificial substrate is separated. Then, a portion of the high doped first conductive semiconductor layer is exposed together by the patterns when the low doped first conductive semiconductor layer is exposed, thereby allowing an electrode pad to be in ohmic contact with the high doped first conductive semiconductor layer. Accordingly, electrical properties of the vertical LED are improved and thus the light emitting efficiency can be enhanced.

In addition, a concavo-convex portion is formed on a surface of the low doped first conductive semiconductor layer, through which light is emitted, thereby enhancing the light emitting efficiency.

According to the present invention, in a light emitting device, an AAO layer with a large number of holes is formed through anodizing treatment of an aluminum layer on a first conductive semiconductor layer, and etching is performed using the aluminum layer with a large number of the holes as a shadow mask, thereby forming patterns in the first conductive semiconductor layer. Then, a first conductive semiconductor layer is formed again on the patterns, so that spaces in the patterns are formed as an air layer to function as scattering centers.

Therefore, since light generated by an active layer is scattered by the scattering centers formed of an air layer with a refraction index different from the first conductive semiconductor layer to be effectively emitted to the outside, the light emitting efficiency can be enhanced.

At this time, the scattering center formed in the pattern may have a diameter of a few μm, e.g., 500 nm or less. A large number of scattering centers are formed in the first conductive semiconductor layer by sufficiently decreasing the diameter of the pattern, and the amount of light reflected to the outside by the scattering centers is increased, thereby enhancing the light emitting efficiency.

DETAILED DESCRIPTION OF THE ILLUSTRATED EMBODIMENTS

Figure 1:
FIG. 1 is a view illustrating a method of fabricating a patterned sapphire substrate according to a prior art.
Figure 2:
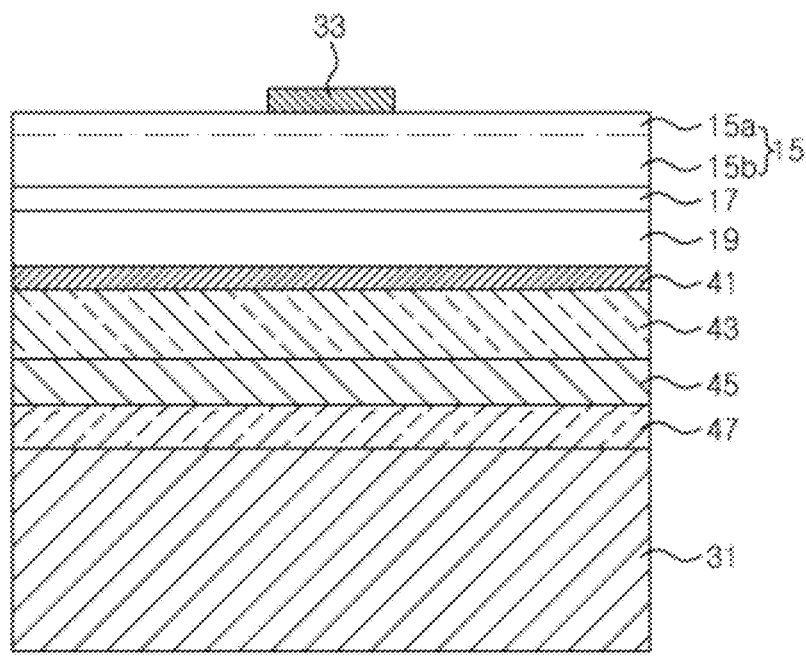
FIG. 2 is a sectional view of a vertical light emitting diode (LED) according to a prior art.

Hereinafter, preferred embodiments of the present invention will be described in detail with reference to the accompanying drawings. The following embodiments are provided only for illustrative purposes so that those skilled in the art can fully understand the spirit of the present invention. Therefore, the present invention is not limited to the following embodiments but may be implemented in other forms. In the drawings, the widths, lengths, thicknesses and the like of elements may be exaggerated for convenience of illustration. Like reference numerals indicate like elements throughout the specification.

FIGS. 3 to 6 are views illustrating a process of fabricating a patterned substrate according to an embodiment of the present invention.

Figure 3:
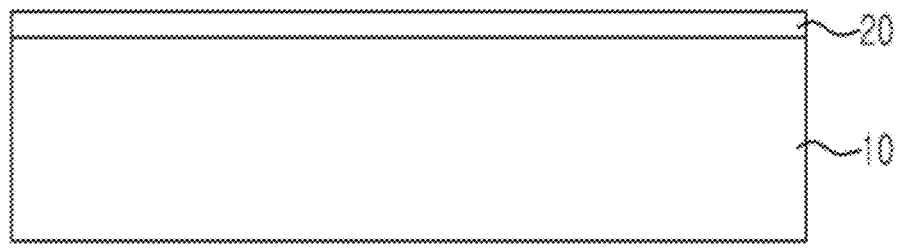
FIGS. 3 to 6 are views illustrating a process of fabricating a patterned substrate according to an embodiment of the present invention.

Referring to FIG. 3, an aluminum layer 20 is formed on a substrate 10. Here, a sapphire substrate may be used as the substrate 10.

The aluminum layer 20 is formed by depositing highly pure aluminum (99.999% Al) in a thickness of 500 nm to 3 μm using a known deposition method such as heat deposition, e-beam deposition, sputtering, or laser deposition. After the aluminum layer 20 is deposited, it is heat treated at 300 to 500° C. under an atmosphere of vacuum, nitrogen, argon or the like. It will be apparent that the heat treatment for the aluminum layer 20 may be omitted.

Figure 4:
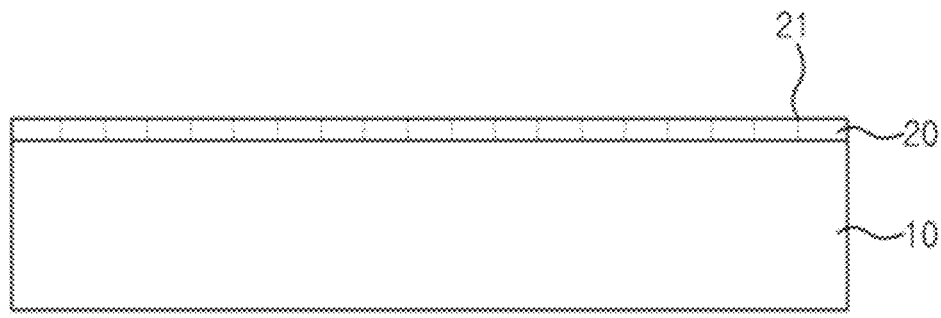

After the aluminum layer 20 is deposited, an anodic aluminum oxide (AAO) layer with a large number of holes 21 is formed by performing an anodizing treatment of the aluminum layer 20 once or more as shown in FIG. 4. Here, the holes 21 are formed up to a surface of the substrate 10.

The process of forming an AAO layer with a large number of the holes 21 in the aluminum layer 20 will be described. An aluminum layer 20 is first subjected to a primary anodizing treatment.

Here, the anodizing treatment is performed by depositing the aluminum layer 20 in an acid solution and applying bias to a light emitting structure.

Preferably, any one selected from a phosphoric acid solution, an oxalic acid solution and a sulfuric acid solution is used as the acid solution.

If the primary anodizing treatment is performed, the aluminum layer 20 is oxidized inward from a surface thereof by an electric chemical reaction, and thus a large number of hollows are formed inward from the surface of the aluminum layer 20.

The portion oxidized by the primary anodizing treatment is then removed by an etchant, e.g., a mixed solution of phosphoric acid and chromic acid. If the oxidized portion in the aluminum layer 20 is removed, a large number of the hollows are formed on the surface of the remaining aluminum layer 20 to correspond to the hollows formed by the primary anodizing treatment.

Thereafter, the remaining aluminum layer 20 in the acid solution is subjected to a secondary anodizing treatment, thereby forming a large number of the holes 21 at positions corresponding to the hollows formed by the primary anodizing treatment up to a surface of the substrate 10 as shown in FIG. 4.

Alternatively, if an AAO layer with a large number of the holes 21 extending up to the top surface of the substrate 10 is formed by performing only a primary anodizing treatment of the aluminum layer 20, subsequent processes after the aforementioned primary anodizing treatment may be omitted. Still alternatively, it will be apparent that the anodizing treatment may be repeated three times or more using the aforementioned method.

Figure 5:
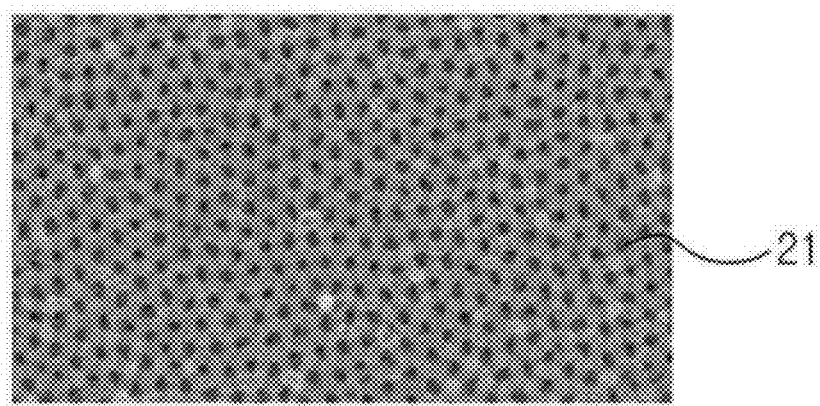

FIG. 5 shows a photograph of an AAO layer formed by performing the anodizing treatment of the aluminum layer 20 using different acid solutions, i.e., a phosphoric acid solution, an oxalic acid solution and a sulfuric acid solution. As can be seen in FIG. 5, the AAO layer with a large number of the holes 21 is formed, and the size of the holes 21 may vary depending on the applied voltage and the acid solution.

Meanwhile, the size of the holes 21 in the AAO layer can be adjusted by controlling an applied voltage, a solution and a processing time in the anodizing treatment. In a state where bias is applied while the AAO layer is deposited in an oxalic acid solution used as an acid solution, the diameter of the holes 21 in the AAO layer may be increased as time elapses.

As such, the aluminum layer 20 with a large number of the holes 21 serves as a shadow mask in a subsequent process.

After forming the aluminum layer 20 having holes 21 with a desired size, the surface of the substrate 10 exposed through the holes 21 in the aluminum layer 20 is etched to a predetermined depth. The surface of the substrate 10 may be etched by a proper method such as dry or wet etching.

Figure 6:
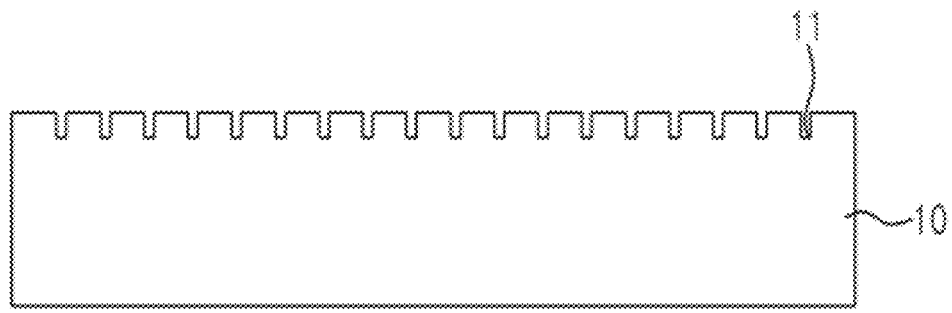

Thereafter, if the aluminum layer 20 is removed, a large number of grooves 11, for example, with a size of 500 nm or less, are formed in the substrate 10 as shown in FIG. 6.

Figure 7:
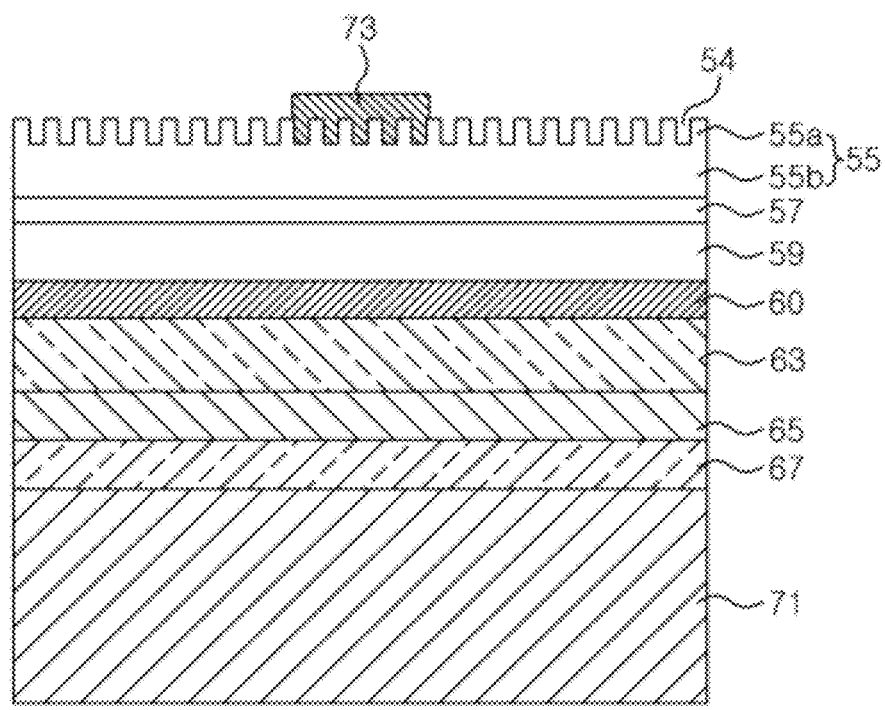
FIG. 7 is a sectional view of a vertical LED according to another embodiment of the present invention.

FIG. 7 is a sectional view of a vertical LED according to another embodiment of the present invention.

Referring to FIG. 7, compound semiconductor layers including a first conductive semiconductor layer 55, an active layer 57 and a second conductive semiconductor layer 59 are formed on a conductive substrate 71. The conductive substrate 71 may be a substrate made of Si, GaAs, GaP, AlGaInP, Ge, SiSe, GaN, AlInGaN, InGaN or the like, or a substrate made of a single metal including Al, Zn, Ag, W, Ti, Ni, Au, Mo, Pt, Pd, Cu, Cr or Fe, or an alloy thereof. Meanwhile, the compound semiconductor layers are III-N-based compound semiconductor layers. First and second conductive types are respectively, designated N-type and P-type, or P-type and N-type.

An ohmic electrode 60 is interposed between the compound semiconductor layers and the conductive substrate 71. The ohmic electrode 60 is in ohmic contact with the second conductive semiconductor layer 59. Preferably, the ohmic electrode 60 is distributed over a large area of the second conductive semiconductor layer 59 for the purpose of current spreading. The ohmic electrode 60 may be formed of Pt, Pd, Rh or Ni, or a metal including at least one thereof.

A metal reflective layer 63 is interposed between the ohmic electrode 60 and the conductive substrate 71.

The metal reflective layer 63 may be formed of a metal with large reflectivity, e.g., Ag or Al, or a metal including at least one thereof.

Meanwhile, a bonding metal layer 67 may be interposed between the metal reflective layer 63 and the conductive substrate 71, and a diffusion barrier layer 65 may be interposed between the bonding metal layer 67 and the metal reflective layer 63. The bonding metal layer 67 enhances an adhesive strength between the conductive substrate 71 and the metal reflective layer 63, thereby preventing the conductive substrate 71 from being separated from the metal reflective layer 63. The diffusion barrier layer 65 prevents metal elements from being diffused into the metal reflective layer 63 from the bonding metal layer 67 or the conductive substrate 71, thereby maintaining reflectivity of the metal reflective layer 63.

In the meantime, an electrode pad 73 is positioned on the top surface of the compound semiconductor layers to be opposite to the conductive substrate 71. The electrode pad 73 may be in ohmic contact with the first conductive semiconductor layer 55. Alternatively, an ohmic electrode layer (not shown) may be interposed between the electrode pad 73 and the compound semiconductor layers. In addition, extension portions (not shown) extending from the electrode pad 73 may be positioned on the compound semiconductor layers.

The extension portions may be employed such that a current flowing into the compound semiconductor layers is widely distributed.

At this time, the first conductive semiconductor layer 55 comprises a low doped first conductive semiconductor layer 55a, portions of which are etched by a pattern produced through etching using an AAO layer, and a high doped first conductive semiconductor layer 55b, portions of which are exposed by the etched portions of the low doped first conductive semiconductor layer 55a. Here, the doping concentration of dopant in the high doped first conductive semiconductor layer 55b is 5 to $9\times10^{18}/cm^3$, while the doping concentration of dopant in the low doped first conductive semiconductor layer 55a is below $5\times10^{18}/cm^3$.

The electrode pad 73 is filled in the etched portions of the low doped first conductive semiconductor layer 55a to be electrically connected to the high doped first conductive semiconductor layer 55b.

FIGS. 8 to 16 are views illustrating a method of fabricating the vertical LED according to the other embodiment of the present invention.

Figure 8:
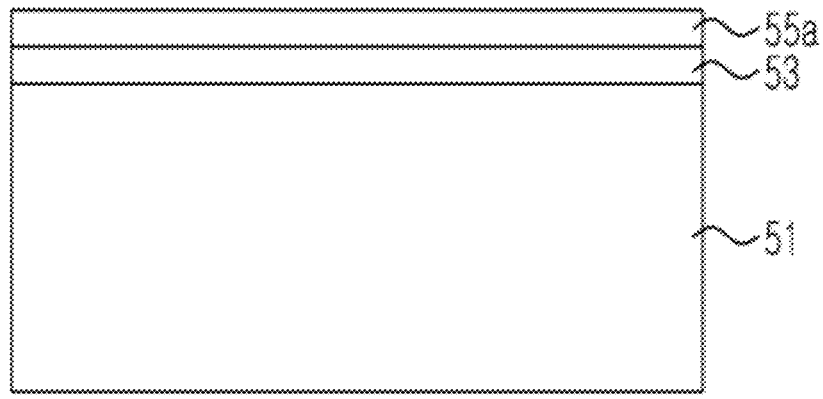
FIGS. 8 to 16 are views illustrating a method of fabricating the vertical LED according to the other embodiment of the present invention.

Referring to FIG. 8, a sacrificial substrate 51 is prepared. The sacrificial substrate 51 may be a sapphire substrate, which is not limited thereto but may be a different kind of substrate.

A buffer layer 53 is formed on the sacrificial substrate 51, and a low doped first conductive semiconductor layer 55a is formed on the buffer layer 53. For example, the low doped first conductive semiconductor layer 55a may be an N-type semiconductor doped with Si dopants. As the low doped first conductive semiconductor layer 55a is formed on the buffer layer 53, it is formed into a low doped layer with a low concentration of dopants.

The buffer layer 53 and the low doped first conductive semiconductor layer 55a are preferably formed by a metal organic chemical vapor deposition (MOCVD) method, but may be formed by a method such as molecular beam epitaxy (MBE) or hydride vapor phase epitaxy (HVPE). The buffer layer 53 and the low doped first conductive semiconductor layer 55a are consecutively formed in the same processing chamber.

Figure 9:
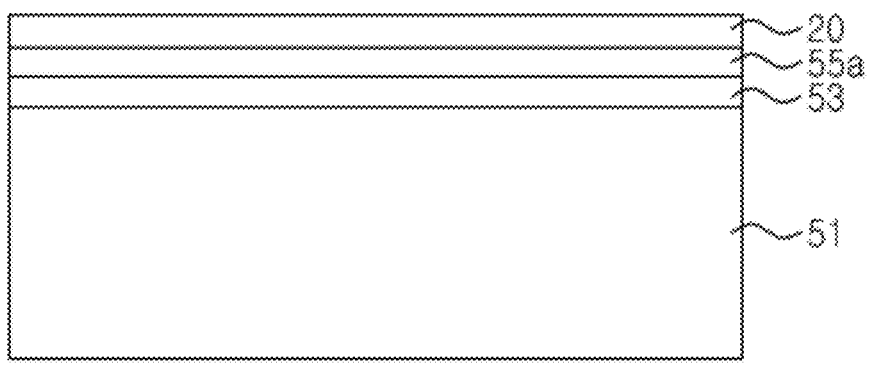

Thereafter, the aluminum layer 20 is formed on the top surface of the low doped first conductive semiconductor layer 55a as shown in FIG. 9.

The aluminum layer 20 is formed by depositing highly pure aluminum (99.999% Al) in a thickness of 500 nm to 3 μm by a known deposition method such as heat deposition, e-beam deposition, sputtering, or laser deposition. After the aluminum layer 20 is deposited, it is heat treated at 300 to 500° C. under an atmosphere of vacuum, nitrogen, argon or the like. It will be apparent that the heat treatment for the aluminum layer 20 may be omitted.

Figure 10:
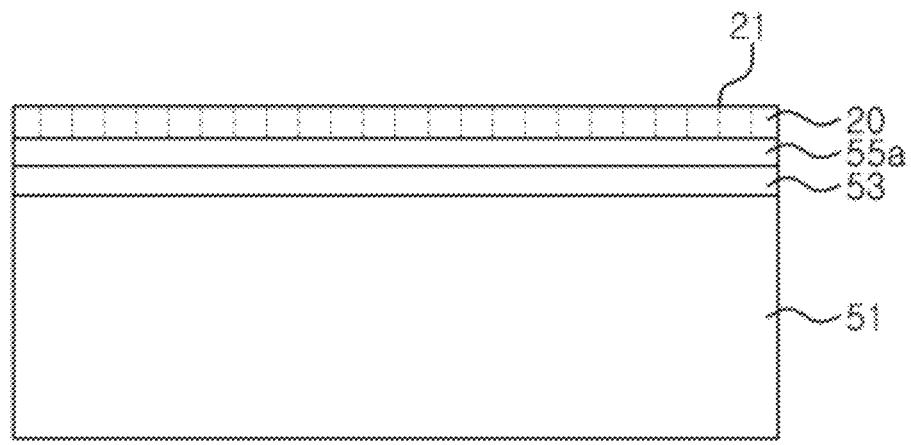

After the aluminum layer 20 is deposited, an AAO layer with a large number of holes 21 is formed by performing an anodizing treatment of the aluminum layer 20 once or more as shown in FIG. 10. Here, the holes 21 are formed up to a surface of the low doped first conductive semiconductor layer 55a.

The process of forming an AAO layer with a large number of the holes 21 in the aluminum layer 20 will be described. First, the aluminum layer 20 is subjected to a primary anodizing treatment.

Here, the anodizing treatment is a treatment in which the aluminum layer 20 is deposited in an acid solution and a bias is applied to a light emitting structure.

Preferably, any one selected from a phosphoric acid solution, an oxalic acid solution and a sulfuric acid solution is used as the acid solution.

If the primary anodizing treatment is performed, the aluminum layer 20 is oxidized inward from a surface thereof by an electric chemical reaction, and thus a large number of hollows are formed inward from the surface of the aluminum layer 20.

The portion oxidized by the primary anodizing treatment is then removed by an etchant, e.g., a mixed solution of phosphoric acid and chromic acid. If the oxidized portion in the aluminum layer 20 is removed, a large number of the hollows are formed on the surface of the remaining aluminum layer 20 to correspond to the hollows formed by the primary anodizing treatment.

Thereafter, the remaining aluminum layer 20 in the acid solution is subjected to a secondary anodizing treatment, thereby forming a large number of the holes 21 at positions corresponding to the hollows formed by the primary anodizing treatment up to a surface of the low doped first conductive semiconductor layer 55a as shown in FIG. 10.

Alternatively, if an AAO layer with a large number of the holes 21 extending up to the top surface of the low doped first conductive semiconductor layer 55a is formed by performing only a primary anodizing treatment of the aluminum layer 20, subsequent processes after the aforementioned primary anodizing treatment may be omitted. Still alternatively, it will be apparent that the anodizing treatment may be repeated three times or more using the aforementioned method.

Figure 11:
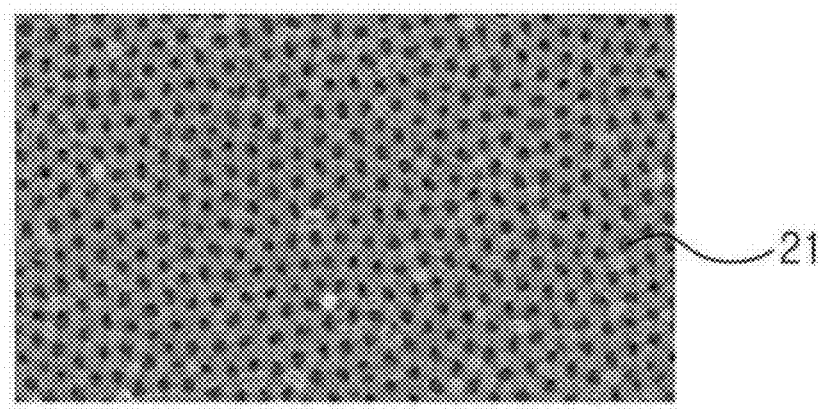

FIG. 11 shows a photograph of an AAO layer formed by performing the anodizing treatment of the aluminum layer 20 using different acid solutions, i.e., a phosphoric acid solution, an oxalic acid solution and a sulfuric acid solution. As can be seen in FIG. 11, the AAO layer with a large number of the holes 21 is formed, and the size of the holes 21 may vary depending on the applied voltage and the acid solution.

Meanwhile, the size of the holes 21 in the AAO layer can be adjusted by controlling an applied voltage, a solution and a processing time in the anodizing treatment. In a state where bias is applied while the AAO layer is deposited in an oxalic acid solution used as an acid solution, the diameter of the holes 21 in the AAO layer may be increased as time elapses.

As such, the aluminum layer 20 with a large number of the holes 21 serves as a shadow mask in a subsequent process.

After forming the aluminum layer 20 having holes with a desired size arrayed therein, the surface of the low doped first conductive semiconductor layer 55a exposed through the holes 21 in the aluminum layer 20 is etched to a predetermined depth. The surface of the low doped first conductive semiconductor layer 55a may be etched by a proper method such as dry or wet etching.

Figure 12:
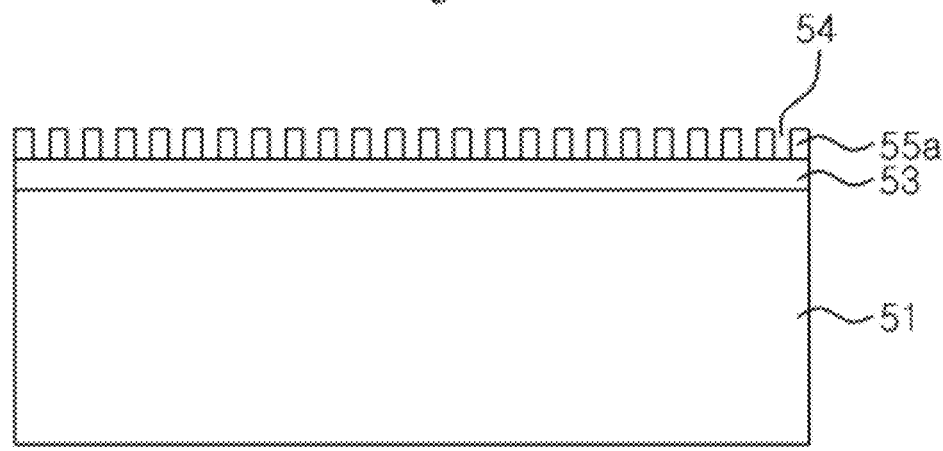

Thereafter, if the aluminum layer 20 is removed, a large number of grooves 54 with a size of 500 nm or less are formed in the low doped first conductive semiconductor layer 55a as shown in FIG. 12. A large number of the grooves 54 serve to expose a high doped first conductive semiconductor layer 55b which will be formed on the low doped first conductive semiconductor layer 55a.

Figure 13:
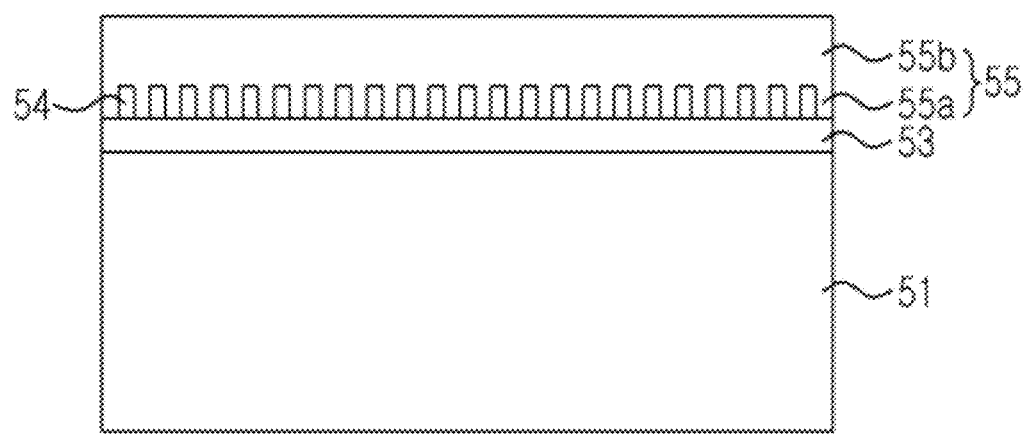

Referring to FIG. 13, a high doped first conductive semiconductor layer 55b is grown on the low doped first conductive semiconductor layer 55a having a large number of the grooves 54. The growth of the high doped first conductive semiconductor layer 55b is performed within the aforementioned processing chamber by an MOCVD method. According to a preferred embodiment of the present invention, the high doped first conductive semiconductor layer 55b is formed of GaN. Since the grooves 54 formed in the low doped first conductive semiconductor layer 55a have a sufficiently small diameter, the grooves 54 are covered with the high doped first conductive semiconductor layer 55b in a state where they are void, whereby the grooves 54 are formed as an air layer.

Figure 14:
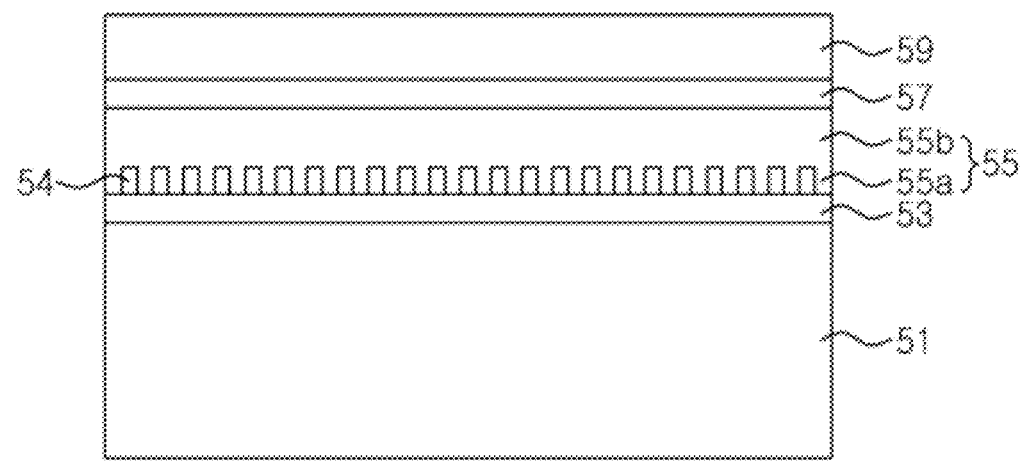

Thereafter, an active layer 57 and a second conductive semiconductor layer 59 are sequentially formed on the top surface of the high doped first conductive semiconductor layer 55b within the same processing chamber, thereby being a laminated structure as shown in FIG. 14. At this time, the second conductive semiconductor layer 59 may be a P-type semiconductor layer.

For example, the second conductive semiconductor layer 59 may be a P-type semiconductor formed by being doped with a P-type dopant such as Zn or Mg.

Figure 15:
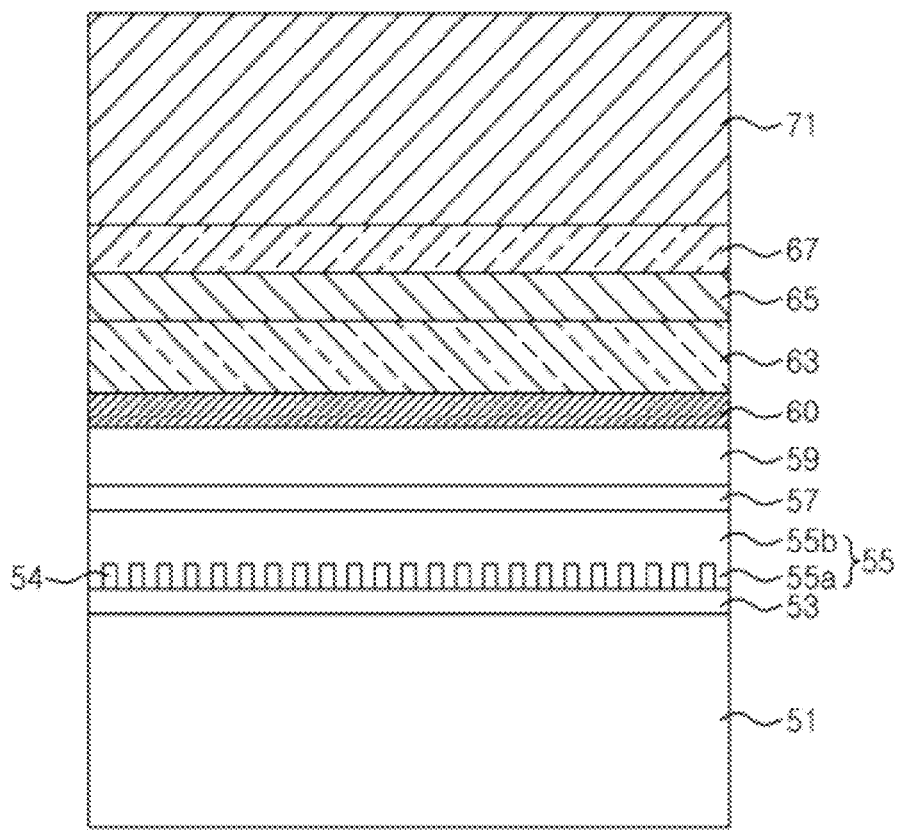

Referring to FIG. 15, an ohmic electrode 60 is formed on the second conductive semiconductor layer 59.

The ohmic electrode 60 is deposited on an entire surface of the second conductive semiconductor layer 59 by a plating or deposition method. The ohmic electrode 60 contains a substance in ohmic contact with the second conductive semiconductor layer 59. If the second conductive semiconductor layer 59 is a P-type semiconductor, the ohmic electrode 60 may be formed of a substance containing Pt, Pd, Rh or Ni. The ohmic electrode 60 is generally heat treated to be in ohmic contact with the second conductive semiconductor layer 59. Since the ohmic electrode is formed of Pt, Pd, Rh or Ni, the heat treatment may be omitted.

A metal reflective layer 63 is then formed on the top surface of the ohmic electrode 60. The metal reflective layer 63 is deposited on an entire surface of the ohmic electrode 60 by a plating or deposition method, and may be formed of a metal layer including Al or Ag.

A conductive substrate 71 is formed on the metal reflective layer 63. The conductive substrate 71 may be formed by attaching a substrate on the compound semiconductor layers, which is made of Si, GaAs, GaP, AlGaInP, Ge, SiSe, GaN, AlInGaN, InGaN or the like, or a substrate made of a single metal including Al, Zn, Ag, W, Ti, Ni, Au, Mo, Pt, Pd, Cu, Cr or Fe, or an alloy thereof. At this time, the conductive substrate 71 may be attached to the metal reflective layer 63 through a bonding metal layer 67, and a diffusion barrier layer 65 may be formed on the metal reflective layer 63 before the bonding metal layer 67 is formed. Meanwhile, the conductive substrate 71 may be formed by a plating method. That is, the conductive substrate 71 may be formed by plating a metal such as Cu or Ni on the metal reflective layer 63. The diffusion barrier layer 65 for preventing diffusion of metal elements and/or the bonding metal layer 67 for enhancing an adhesive strength may be added.

Figure 16:
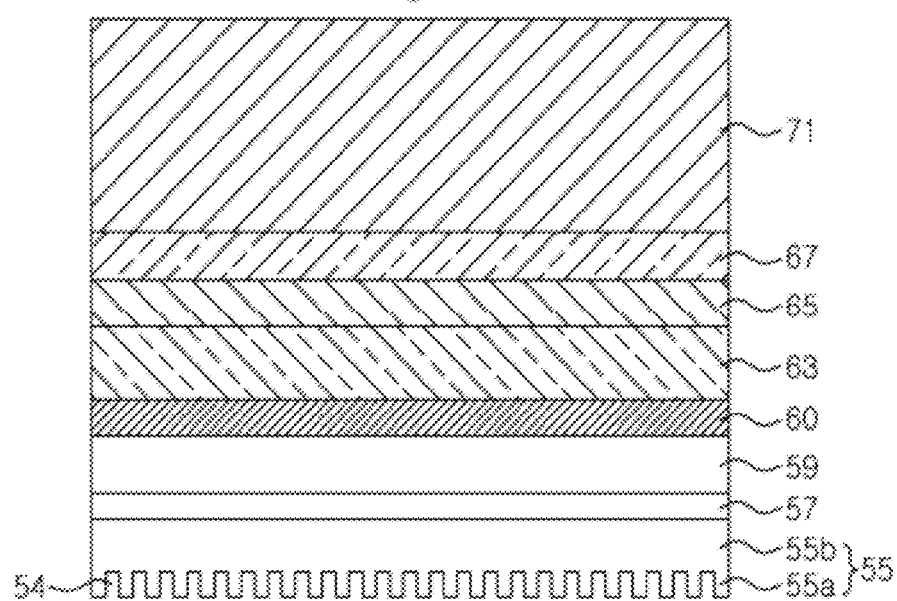

Referring to FIG. 16, the sacrificial substrate 51 is separated from the compound semiconductor layers. The sacrificial substrate 51 may be separated using a laser lift-off (LLO) technique or a mechanical or chemical method. At this time, the buffer layer 53 is also removed to thereby expose the first conductive semiconductor layer 55.

At this time, the low doped first conductive semiconductor layer 55a is exposed to have a pattern shape with a large number of the grooves 54. In addition, portions of the high doped first conductive semiconductor layer 55b are exposed by a large number of the grooves 54 formed in the low doped first conductive semiconductor layer 55a.

Subsequently, the electrode pad 73 (in FIG. 7) is formed on the low doped first conductive semiconductor layer 55a.

At this time, since the electrode pad 73 is made of a metal, the electrode pad 73 is filled in a large number of the grooves 54 formed in the low doped first conductive semiconductor layer 55a to be in ohmic contact with the high doped first conductive semiconductor layer 55b when the electrode pad 73 is formed on the low doped first conductive semiconductor layer 55a.

While forming the electrode pad 73, extension portions (not shown) extending from the electrode pad 73 may be formed. Accordingly, the vertical LED in FIG. 7 is fabricated.

Meanwhile, before the electrode pad 73 is formed, an ohmic electrode (not shown) may be formed on the first conductive semiconductor layer 55. The ohmic electrode is in ohmic contact with the first conductive semiconductor layer 55, and the electrode pad 73 is electrically connected to the ohmic electrode.

Figure 17:
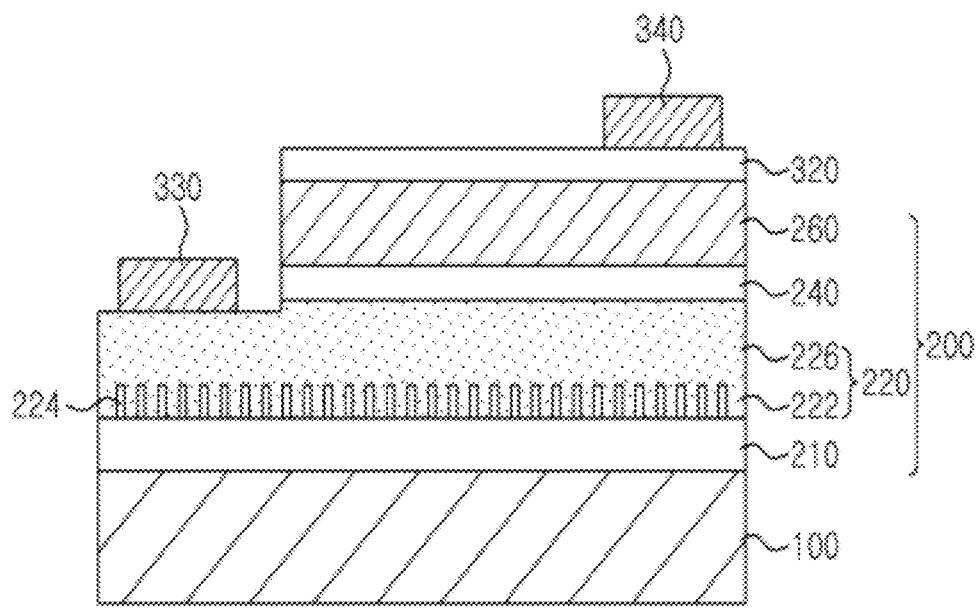
FIG. 17 is a schematic sectional view of an LED according to a further embodiment of the present invention.

FIG. 17 is a sectional view illustrating an LED according to a further embodiment of the present invention.

Referring to FIG. 17, the LED according to the embodiment of the present invention includes a substrate 100 that functions as a base. A light emitting cell 200 comprising an N-type semiconductor layer 220, an active layer 240 and a P-type semiconductor layer 260, is formed on the substrate 100.

Although the LED of this embodiment has one light emitting cell 200, an LED having a plurality of light emitting cells 200 to be operated by AC power is also included in the spirit and scope of the present invention. Meanwhile, in the light emitting cell 200, a portion of the N-type semiconductor layer 220 is exposed upward through mesa formation, and an N-type electrode pad 330 is formed in the exposed portion. Although the substrate 100 is preferably made of a sapphire material, it may be made of another material with large conductivity, such as SiC.

As shown in this figure, the active layer 240 is restrictedly formed on one region of the N-type semiconductor layer 220 through mesa formation, and the P-type semiconductor layer 260 is formed on the active layer 240. Thus, the region of the N-type semiconductor layer 220 comes into contact with the active layer 240, and the other region of the N-type semiconductor layer 220 is exposed to the outside. Although a portion of the N-type semiconductor layer 220 is removed to form the N-type electrode pad in this embodiment, a vertical LED, in which the substrate under the N-type semiconductor layer 220 is removed, is also within the spirit and scope of the present invention.

The N-type semiconductor layer 220 may be formed of N-type $Al_xIn_yGa_{1-x-y}N(0 \leq x, y, x+y \leq 1)$, and may contain an N-type clad layer. In addition, the P-type semiconductor layer 260 may be formed of P-type $Al_xIn_yGa_{1-x-y}N(0 \leq x, y, x+y \leq 1)$, and may contain a P-type clad layer. The N-type semiconductor layer 220 may be formed by being doped with Si as a dopant, and the P-type semiconductor layer 260 may be formed by being doped, for example, with Zn or Mg as a dopant.

In particular, the N-type semiconductor layer 220 includes a large number of scattering centers 224 formed of an air layer. The scattering centers 224 are formed of the air layer produced in the N-type semiconductor layer 220 through etching using an AAO layer.

The scattering effect within the N-type semiconductor layer 220 can be maximized by a large number of the scattering centers 224 formed of an air layer with a refraction index different from the N-type semiconductor layer 220. The configuration of the N-type semiconductor layer 220 will be described in detail later.

In addition, a transparent electrode layer 320 made of a metal or metal oxide such as Ni/Au, ITO or ZnO is formed on the top surface of the P-type semiconductor layer 260, and a P-type electrode pad 340 is formed at a region of the top surface of the transparent electrode layer 320.

The active layer 240 is a region in which electrons and holes are recombined, and contains InGaN. The wavelength of light emitted from the light emitting cell 200 is determined depending on the kind of material of the active layer 240. The active layer 240 may be a multi-layered film having quantum well layers and barrier layers repeatedly formed. The barrier and quantum well layers may be binary to quaternary compound semiconductor layers expressed by a formula of $Al_xIn_yGa_{1-x-y}N(0 \leq x, y, x+y \leq 1)$.

A buffer layer 210 may be interposed between the substrate 100 and the N-type semiconductor layer 220. The buffer layer 210 is used to prevent lattice mismatch between the substrate 100 and semiconductor layers which will be formed on the buffer layer 210. If the substrate 100 is conductive, the buffer layer 210 is formed of an insulating or semi-insulating material so as to allow the substrate 100 to be electrically insulated from the light emitting cell 200. For example, the buffer layer 210 may be formed of a nitride such as AlN or GaN. In the meantime, if the substrate 100 is insulative like sapphire, the buffer layer 210 may be formed of a conductive material.

As has been briefly described above, the N-type semiconductor layer 220 comprises a first N-type semiconductor layer 222 and a second N-type semiconductor layer 226 thereon, sequentially grown. A large number of the scattering centers 224 formed of an air layer formed through etching using an AAO layer are provided between the first and second N-type semiconductor layers 222 and 226.

The scattering centers 224 are formed by growing the first N-type semiconductor layer 222, performing anodizing treatment of an aluminum layer on the first N-type semiconductor layer 222 to form an AAO layer with a large number of holes, etching the first N-type semiconductor layer 222 using the aluminum layer with a large number of the holes as a shadow mask to form patterns with a large number of grooves, and then growing the second N-type semiconductor layer 226 on the patterns such that the grooves between the patterns is not filled and thus left as an air layer.

The scattering centers 224 are formed of an air layer with a refractive index different from the N-type semiconductor material within the N-type semiconductor layer 220 to function as a reflecting minor for reflecting light using the difference of the refraction indices.

Accordingly, the scattering centers 224 can reduce loss of light generated from the active layer 240 in the semiconductor layer, and scattering is effectively generated by the scattering centers 224, thereby emitting light to the outside of the LED.

Hereinafter, a method of fabricating an LED according to an embodiment of the present invention will be described with reference to FIGS. 18 to 24.

Figure 18:
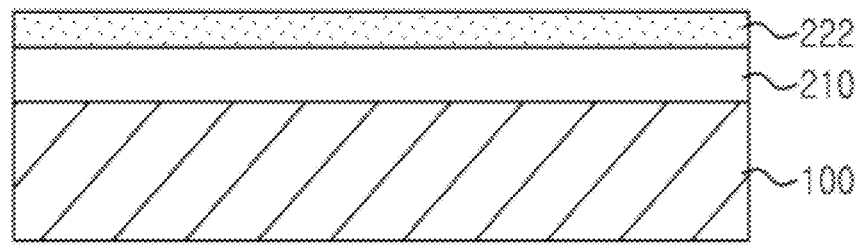
FIGS. 18 to 24 are views illustrating a process of fabricating the LED shown in FIG. 17.

Referring to FIG. 18, a buffer layer 210 is formed on a substrate 100, and a first N-type semiconductor layer 222 is formed on the buffer layer 210. The buffer layer 210 and the first N-type semiconductor layer 222 are preferably formed by an MOCVD method, but may be formed by a method such as MBE or HVPE. In addition, the buffer layer 210 and the first N-type semiconductor layer 222 may be consecutively formed within the same processing chamber.

In particular, the first N-type semiconductor layer 222 is a layer formed by being doped with Si dopants. The first N-type semiconductor layer 222 is grown in a vertical direction on the substrate 100 with the buffer layer 210 formed thereon. The N-type semiconductor layer 222 is grown on a substrate through MOCVD.

Figure 19:
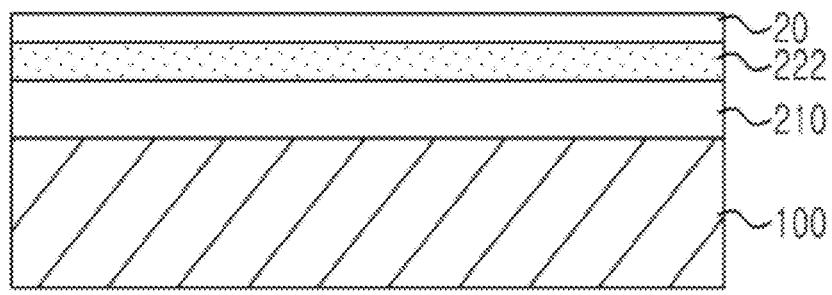

Thereafter, an aluminum layer 20 is formed on the top surface of the first N-type semiconductor layer 222 as shown in FIG. 19.

The aluminum layer 20 is formed by depositing highly pure aluminum (99.999% Al) in a thickness of 500 nm to 3 μm by a known deposition method such as heat deposition, e-beam deposition, sputtering, or laser deposition. After the aluminum layer 20 is deposited, it is heat treated at 300 to 500° C. under an atmosphere of vacuum, nitrogen, argon or the like. It will be apparent that the heat treatment for the aluminum layer 20 may be omitted.

Figure 20:
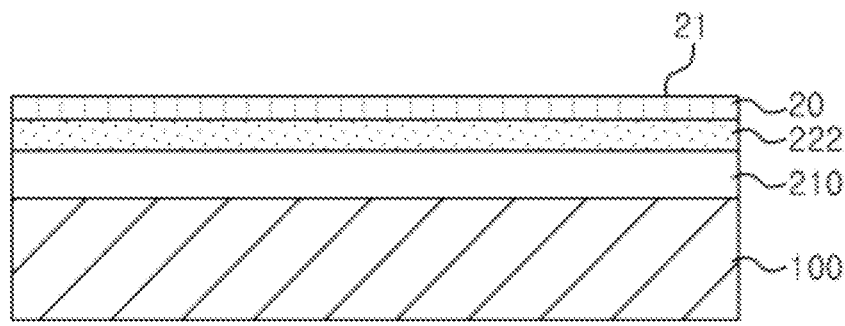

After the aluminum layer 20 is deposited, an AAO layer with a large number of holes 21 is formed by performing an anodizing treatment of the aluminum layer 20 once or more as shown in FIG. 20. Here, the holes 21 are formed up to a surface of the first N-type semiconductor layer 222.

The process of forming an AAO layer with a large number of the holes 21 in the aluminum layer 20 will be described. First, the aluminum layer 20 is subjected to a primary anodizing treatment.

Here, the anodizing treatment is a treatment in which the aluminum layer 20 is deposited in an acid solution and a bias is applied to a light emitting structure.

Preferably, any one selected from a phosphoric acid solution, an oxalic acid solution and a sulfuric acid solution is used as the acid solution.

If the primary anodizing treatment is performed, the aluminum layer 20 is oxidized inward from a surface thereof by an electric chemical reaction, and thus a large number of hollows are formed inward from the surface of the aluminum layer 20.

The portion oxidized by the primary anodizing treatment is then removed by an etchant, e.g., a mixed solution of phosphoric acid and chromic acid. If the oxidized portion in the aluminum layer 20 is removed, a large number of the hollows are formed on the surface of the remaining aluminum layer 20 to correspond to the hollows formed by the primary anodizing treatment.

Thereafter, the remaining aluminum layer 20 in the acid solution is subjected to a secondary anodizing treatment, thereby forming a large number of the holes 21 at positions corresponding to the hollows formed by the primary anodizing treatment up to a surface of the first N-type semiconductor layer 222 as shown in FIG. 20.

Alternatively, if an AAO layer with a large number of the holes 21 extending up to the top surface of the first N-type semiconductor layer 222 is formed by performing only a primary anodizing treatment of the aluminum layer 20, subsequent processes after the aforementioned primary anodizing treatment may be omitted. Still alternatively, it will be apparent that the anodizing treatment may be repeated three times or more using the aforementioned method.

Figure 21:
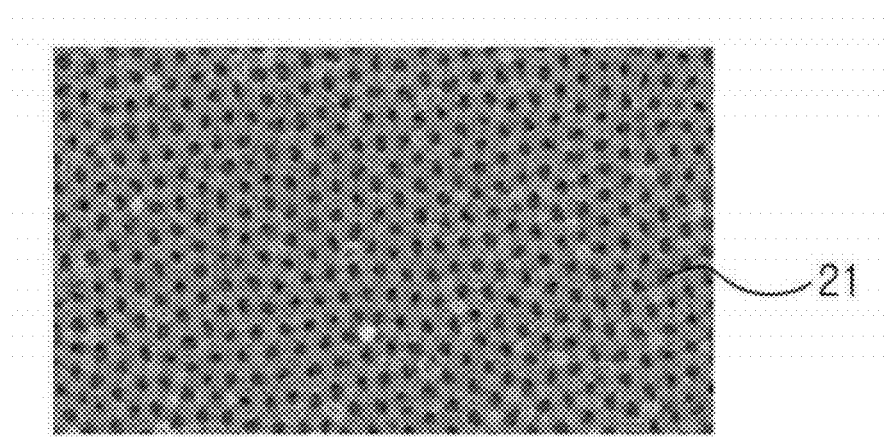

FIG. 21 shows a photograph of an AAO layer formed by performing the anodizing treatment of the aluminum layer 20 using different acid solutions, i.e., a phosphoric acid solution, an oxalic acid solution and a sulfuric acid solution. As can be seen in FIG. 11, the AAO layer with a large number of the holes 21 is formed, and the size of the holes 21 may vary depending on the applied voltage and acid solution.

Meanwhile, the size of the holes 21 in the AAO layer can be adjusted by controlling an applied voltage, a solution and a processing time in the anodizing treatment. In a state where bias is applied while the AAO layer is deposited in an oxalic acid solution used as an acid solution, the diameter of the holes 21 in the AAO layer may be increased as time elapses.

As such, the aluminum layer 20 with a large number of the holes 21 serves as a shadow mask in a subsequent process.

After forming the aluminum layer 20 having holes 21 with a desired size arrayed therein, the surface of the first N-type semiconductor layer 222 exposed through the holes 21 in the aluminum layer 20 is etched to a predetermined depth. The surface of the first N-type semiconductor layer 222 may be etched by a proper method such as dry or wet etching.

Figure 22:
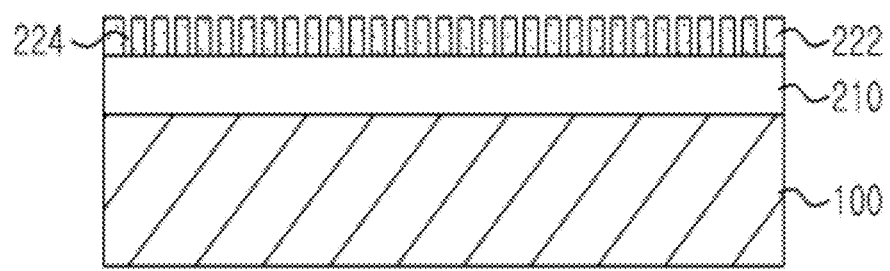

Thereafter, if the aluminum layer 20 is removed, a large number of grooves 224 with a size of 500 nm or less are formed in the first N-type semiconductor layer 222 as shown in FIG. 22. A large number of the grooves 224 function as scattering centers.

Figure 23:
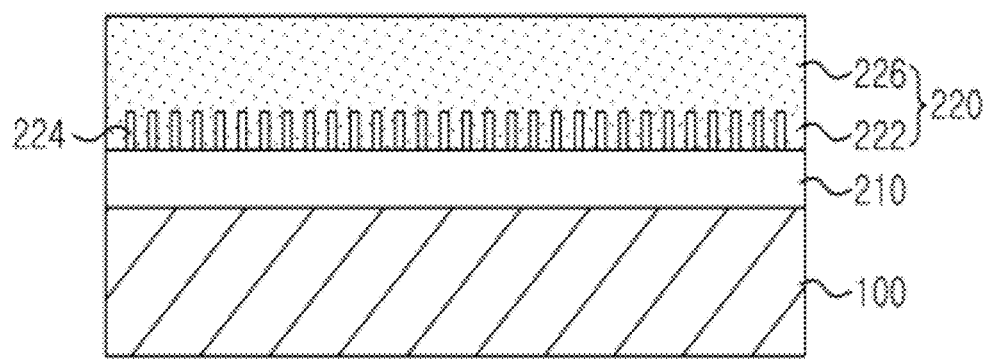

Referring to FIG. 23, a second N-type semiconductor layer 226 is formed on the first N-type semiconductor layer 222 with the scattering centers 224 formed therein. The second N-type semiconductor layer 226 is grown within the aforementioned processing chamber by an MOCVD method. According to a preferred embodiment of the present invention, the second N-type semiconductor layer 226 is formed of GaN. Since the grooves 224 formed in the first N-type semiconductor layer 222 have a sufficiently small diameter, the grooves 224 are covered with the second N-type semiconductor layer 226 in a state where they are void, whereby the grooves 224 are formed as an air layer. Accordingly, the grooves 224 function as scattering centers.

Figure 24:
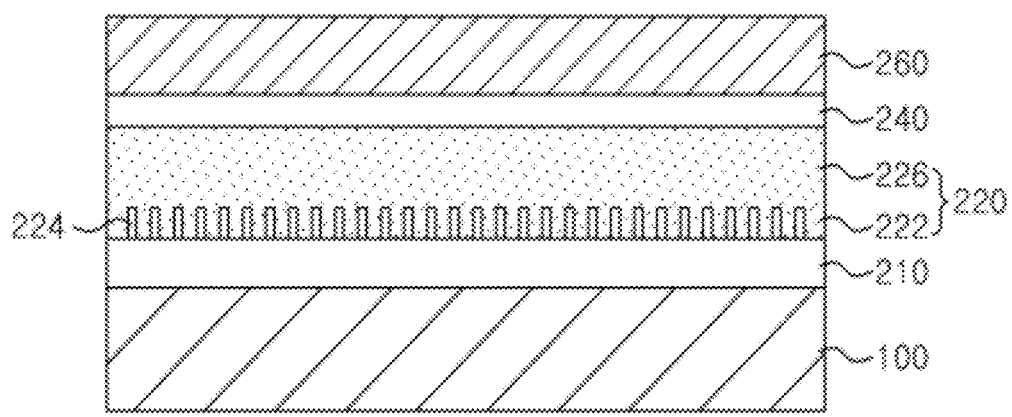

Thereafter, an active layer 240 and a P-type semiconductor layer 260 are sequentially formed on the top surface of the second N-type semiconductor layer 226 within the same processing chamber, thereby being a laminated structure as shown in FIG. 24. At this time, the P-type semiconductor layer 260 is doped with a P-type dopant such as Zn or Mg.

Although not shown, a process of forming a transparent electrode layer 320 (see FIG. 17) selected from Ni/Au, ITO and ZnO on the top surface of the P-type semiconductor layer 260, a process of forming a mesa for exposing a portion of the N-type semiconductor layer 220, and a process of respectively forming P-type and N-type electrode pads 340 and 330 at exposed regions of the transparent electrode layer 320 and the N-type semiconductor layer 220 may be performed. Accordingly, the LED with a structure shown in FIG. 17 can be fabricated.

Alternatively, a vertical LED having P-type and N-type electrodes 340 and 330 formed on upper and lower portions of a light emitting cell 200 can be fabricated by performing a process of removing the substrate 100 from the light emitting cell 200.

The present invention is not limited to the aforementioned embodiments, but various modifications and changes can be made thereto by those skilled in the art. The modifications and changes are included in the spirit and scope of the invention defined by the appended claims.

For example, a sapphire substrate is used in an embodiment of the present invention. However, it will be apparent that different types of substrates, such as a spinel substrate, a Si substrate, a SiC substrate, a ZnO substrate, a GaAs substrate and a GaN substrate, may be used instead of the sapphire substrate.

What is claimed is:

1. A method of fabricating a light emitting device having a first conductivity-type semiconductor layer, a second conductivity-type semiconductor layer and an active layer interposed therebetween formed on a substrate, the method comprising:
forming the first conductivity-type semiconductor layer on the substrate, wherein the first conductivity-type semiconductor layer comprises a first portion and a second portion;
forming an aluminum layer on the first portion of the first conductivity-type semiconductor layer;
forming an anodic aluminum oxide (AAO) layer having a large number of holes formed therein by performing an anodizing treatment of the aluminum layer;
etching and patterning the first portion of the first conductivity-type semiconductor layer using the aluminum layer with the large number of the holes as a shadow mask so that the first portion of the first conductivity-type semiconductor layer is etched, wherein the etched first portion comprises a plurality of scattering centers comprising an air layer, and the first portion is alternately arranged between each scattering center of the plurality of scattering centers;
removing the aluminum layer from the first portion of the first conductivity-type semiconductor layer;
forming the second portion of the first conductivity-type semiconductor layer on the first portion of the first conductivity-type semiconductor layer; and
forming the active layer and the second conductivity-type semiconductor layer on the first portion of the first conductivity-type semiconductor layer and the plurality of scattering centers.

2. A light emitting device, comprising:
a substrate;
a first conductivity-type semiconductor layer disposed on the substrate;
an active layer disposed on the first conductivity-type semiconductor layer; and
a second conductivity-type semiconductor layer disposed on the active layer, wherein the first conductivity-type semiconductor layer comprises a plurality of scattering centers formed of an air layer,
wherein the first conductivity-type semiconductor layer comprises a first portion and a second portion,
wherein the first portion is alternately arranged between each scattering center of the plurality of scattering centers, and
wherein the second portion is arranged on the first portion and the plurality of scattering centers.

3. The light emitting device of claim 2, wherein the first conductivity-type semiconductor layer comprises a first layer having the plurality of scattering centers formed of the air layer and a second layer formed on the first layer.

4. The light emitting device of claim 2, wherein the plurality of scattering centers formed of the air layer are formed in the first conductivity-type semiconductor layer through etching using an anodic aluminum oxide (AAO) layer as a shadow mask.

5. The light emitting device of claim 2, wherein the air layer is contained within the first conductivity-type semiconductor layer.

6. The light emitting device of claim 2, wherein the active layer is not exposed to the air layer.

7. The light emitting device of claim 6, wherein the second conductivity-type semiconductor layer is not exposed to the air layer.

8. The light emitting device of claim 2, further comprising a buffer layer arranged on the substrate, wherein the air layer is directly between the buffer layer and the first conductivity-type semiconductor layer.

9. A light emitting device, comprising:
a substrate;
a first conductivity-type semiconductor layer disposed on the substrate;
an active layer disposed on the first conductivity-type semiconductor layer; and a second conductivity-type semiconductor layer disposed on the active layer, wherein the first conductivity-type semiconductor layer comprises a plurality of scattering centers formed of an air layer, wherein the first conductivity-type semiconductor layer comprises a first portion and a second portion, wherein the first portion comprises the plurality of scattering centers arranged therein, and wherein the second portion is arranged on the first portion.

10. The light emitting device of claim 9, wherein the first conductivity-type semiconductor layer comprises a first layer having the plurality of scattering centers formed of the air layer and a second layer formed on the first layer.

11. The light emitting device of claim 9, wherein the plurality of scattering centers formed of the air layer are formed in the first conductivity-type semiconductor layer through etching using an anodic aluminum oxide (AAO) layer as a shadow mask.

12. The light emitting device of claim 9, wherein the air layer is contained within the first conductivity-type semiconductor layer.

13. The light emitting device of claim 9, wherein the active layer is not exposed to the air layer.

14. The light emitting device of claim 13, wherein the second conductivity-type semiconductor layer is not exposed to the air layer.

15. The light emitting device of claim 9, further comprising a buffer layer arranged on the substrate, wherein the air layer is directly between the buffer layer and the first conductivity-type semiconductor layer.

16. A method of fabricating a light emitting device having a first conductivity-type semiconductor layer, a second conductivity-type semiconductor layer and an active layer interposed therebetween formed on a substrate, the method comprising:

forming the first conductivity-type semiconductor layer on the substrate, wherein the first conductivity-type semiconductor layer comprises a first portion and a second portion;

forming an aluminum layer on the first portion of the first conductivity-type semiconductor layer;

forming an anodic aluminum oxide (AAO) layer having a large number of holes formed therein by performing an anodizing treatment of the aluminum layer;

etching and patterning the first portion of the first conductivity-type semiconductor layer using the aluminum layer with the large number of the holes as a shadow mask so that the first portion of the first conductivity-type semiconductor layer is etched, wherein the etched first portion comprises a plurality of scattering centers comprising an air layer, and the first portion comprises the plurality of scattering centers arranged therein;

removing the aluminum layer from the first portion of the first conductivity-type semiconductor layer;

forming the second portion of the first conductivity-type semiconductor layer on the first portion of the first conductivity-type semiconductor layer; and forming the active layer and the second conductivity-type semiconductor layer on the first portion of the first conductivity-type semiconductor layer and the plurality of scattering centers.

\* \* \* \* \*